United States Patent
Ghyselen (10) Patent No.: US 10,343,902 B2
(45) Date of Patent: Jul. 9, 2019

(54) STRUCTURE FOR DEVICE WITH INTEGRATED MICROELECTROMECHANICAL SYSTEMS

(71) Applicant: Soitec, Bernin (FR)

(72) Inventor: Bruno Ghyselen, Seyssinet (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 15/449,649

(22) Filed: Mar. 3, 2017

(65) Prior Publication Data

US 2017/0253478 A1    Sep. 7, 2017

(30) Foreign Application Priority Data

Mar. 7, 2016   (FR) ...................................... 16 51874

(51) Int. Cl.
  *B81C 1/00*  (2006.01)
  *B81B 7/00*  (2006.01)

(52) U.S. Cl.
  CPC ........ *B81C 1/00801* (2013.01); *B81B 7/0025* (2013.01); *B81C 1/00182* (2013.01); *B81C 1/00626* (2013.01); *B81B 2203/0127* (2013.01); *B81B 2207/015* (2013.01); *B81C 2201/056* (2013.01)

(58) Field of Classification Search
  None
  See application file for complete search history.

(56) References Cited

U.S. PATENT DOCUMENTS

| | | | |
|---|---|---|---|
| 5,888,297 A | 3/1999 | Ogura | |
| 6,756,672 B1 * | 6/2004 | You | ................... H01L 21/76802 257/637 |
| 2003/0197176 A1 | 10/2003 | Spallas et al. | |

(Continued)

FOREIGN PATENT DOCUMENTS

| | | |
|---|---|---|
| EP | 2527810 A2 | 11/2012 |
| EP | 2599745 A1 | 6/2013 |
| EP | 2599746 | 6/2013 |

(Continued)

OTHER PUBLICATIONS

European Search Report for European Application No. 17159250 dated Mar. 27, 2017, 8 pages.

(Continued)

*Primary Examiner* — Long Pham
(74) *Attorney, Agent, or Firm* — TraskBritt (57) ABSTRACT

A method for manufacturing a structure comprises a) providing a donor substrate comprising front and rear faces; b) providing a support substrate; c) forming an intermediate layer on the front face of the donor substrate or on the support substrate; d) assembling the donor and support substrates with the intermediate layer therebetween; e) thinning the rear face of the donor substrate to form a useful layer of a useful thickness having a first face disposed on the intermediate layer and a second free face; and wherein the donor substrate comprises a buried stop layer and a fine active layer having a first thickness less than the useful thickness, between the front face of the donor substrate and the stop layer; and after step e), removing, in first regions of the structure, a thick active layer delimited by the second free face of the useful layer and the stop layer.

19 Claims, 9 Drawing Sheets

(56) References Cited

U.S. PATENT DOCUMENTS

2005/0205930 A1  9/2005  Williams, Jr.

FOREIGN PATENT DOCUMENTS

EP     2952472 A2   12/2015
WO    2007072406 A1   6/2007

OTHER PUBLICATIONS

French Search Report for French Application No. 1651874 dated Oct. 26, 2016, 2 pages.
Robert et al., M&NEMS: A new approach for ultra-low cost 3D inertial sensor, IEEE Sensors Conference, Oct. 25-28, 2009, abstract only.
Tadigadapa et al., MEMS Materials and Processes Handbook, Reza Ghodssi, Pinyen Lin, Editors, Springer, ISSN 1936-4407, ISBN 978-0-387-47316-1, (2011), Chapters 7 and 8, abstract only.

\* cited by examiner

STRUCTURE FOR DEVICE WITH INTEGRATED MICROELECTROMECHANICAL SYSTEMS

CROSS-REFERENCE TO RELATED APPLICATION

This application claims the benefit of the filing date of French Patent Application Serial No. 1651874, filed Mar. 7, 2016, for "Structure for Device with Integrated Microelectromechanical Systems."

TECHNICAL FIELD

The present disclosure relates to the field of integrated MEMS devices, and particularly to a structure comprising a useful layer with a plurality of active layers.

BACKGROUND

Microelectromechanical systems (MEMS) and nanoelectromechanical systems (NEMS), used for producing sensors or actuators, normally comprise a fixed part and at least one part suspended with respect to the fixed part. The suspended part is able to move and/or deform under the effect of an external force that may be of mechanical, electrical or magnetic origin.

An article by P. Robert et al. ("M&NEMS: A new approach for ultra-low cost 3D inertial sensor," *IEEE Sensors Conference* 2009, 25-28 Oct. 2009), describes a structure comprising MEMS and NEMS devices, forming an accelerometer. The structure comprises an active part formed by two distinct thicknesses. The NEMS device, which forms a strain gauge, uses a first thickness, and the MEMS device, which forms a seismic mass, uses the first and second thicknesses (or in other words, uses the whole of the active part). Such an active part can be produced from an SOI substrate that defines a first layer having the first thickness. An epitaxial growth step is next implemented in order to produce a second layer having the second thickness. This second thickness is normally thicker than the first thickness. The second thickness is typically around a few tens of microns, compared with at least one micron for the first thickness. The epitaxial growth step for these ranges of thicknesses is therefore lengthy and expensive. Moreover, the epitaxially grown layer contains polycrystalline regions because of the presence of a discontinuous layer of oxide on the first layer (SOI) for defining the devices. These polycrystalline regions may give rise to defects in the structure, impacting functioning of the end devices.

An alternative method for manufacturing such a structure comprising MEMS and NEMS devices is disclosed in European Patent No. EP 2599746. The method comprises the production, on a first monocrystalline semiconductor substrate, of a locally porous region or of a region locally implemented with a plurality of pillars. Next, an epitaxy on this substrate makes it possible to form the first layer having the first thickness. This first layer is then worked to define the NEMS device and to leave clear a membrane, by etching the locally porous region or the region with pillars, used as a local sacrificial layer. A deposition of oxide is next carried out in order to reblock the openings (under the membrane) and to create a sacrificial layer over the entire surface of the first substrate, above the first layer, and, therefore, in particular on the NEMS membrane. The sacrificial layer of oxide is assembled on a supporting substrate, and then the first substrate is thinned by its rear face in order to form the active part. The thickness of this active part is the sum of the first and second thicknesses. The thinned face is worked, in order to define the NEMS device and to remove the second layer having the second thickness above the NEMS device, stopping on the oxide layer that was used previously to reblock the openings. Finally, the membranes at the NEMS and MEMS devices are released by local removal of the sacrificial layer of buried oxide.

This method requires several steps of lithography, etching and deposition in order successively to define, work, and release membranes and then encapsulate them in a sacrificial layer, before bonding on the support substrate, which gives rise to high manufacturing costs. Moreover, the predefinition of the NEMS device on the first substrate, before bonding on the support substrate, may give rise to loss of efficiency. First, because the bonding step is very sensitive to any residue of topology, roughness or particles, and second, because any defect in alignment between the NEMS (buried) and MEMS devices during the working of the thinned rear face of the first substrate may impact functioning of the end device.

BRIEF SUMMARY

One object of the present disclosure is to propose a structure remedying all or some of the drawbacks of the prior art. In particular, the object of the disclosure relates to a structure for a device with microelectromechanical systems allowing the integration of NEMS and MEMS devices.

The disclosure relates to a method for manufacturing a structure, the method comprising:
a) the provision of a donor substrate comprising a front face and a rear face;
b) the provision of a support substrate;
c) the formation of an intermediate layer on the front face of the donor substrate or on the support substrate;
d) the assembly of the donor substrate and support substrate in order to dispose the intermediate layer between the two substrates;
e) the thinning of the rear face of the donor substrate in order to form a useful layer of a useful thickness having a first face disposed on the intermediate layer and a second free face.

The method is remarkable in that:
the donor substrate comprises a buried stop layer and a fine active layer having a first thickness less than the useful thickness, between the front face of the donor substrate and the stop layer; and
after step e), the method comprises the removal, in first regions of the structure, of a thick active layer delimited by the second free face of the useful layer and the stop layer.

The presence of the buried stop layer separating the useful layer, the thick active layer and the fine active layer allows for removal of the thick active layer in the first regions of the structure, without damage to the underlying fine active layer. The method according to the disclosure thus procures a structure suitable for the manufacture of devices comprising integrated microelectromechanical and nanoelectromechanical systems, each requiring different thicknesses of active layers; in particular, the fine active layer required for nanosystems has a very well-controlled and uniform thickness.

According to advantageous features of the disclosure, taken alone or in combination:
the fine active layer is continuous over the entire extent of the donor substrate;

the fine active layer is non-continuous over the entire extent of the donor substrate;
the useful thickness is greater than 3 microns;
the first thickness is less than 20% of the useful thickness;
the first thickness is less than 1 micron;
the stop layer is formed by ion implantation;
the species implanted are chosen from hydrogen, helium, argon, boron, oxygen, nitrogen and carbon;
the donor substrate is produced by:
  the formation of a layer, on the front face of an initial substrate, with a chemical composition or crystalline structure different from that of the initial substrate, forming the stop layer;
  the formation of a fine active layer of controlled thickness on the stop layer;
the manufacturing method comprises:
  the etching of the stop layer so that the useful layer comprises only the fine active layer in the first regions;
  the etching of the first thickness of the fine active layer in first patterns, in the first regions;
  the etching of the useful thickness of the useful layer in second patterns, in second regions of the structure;
  the removal of the intermediate layer in at least part of the first regions and the second regions of the structure, in order to release at least one membrane of the fine active layer and at least one membrane of the useful layer.

The disclosure also relates to a structure comprising:
a support substrate;
an intermediate layer disposed on the support substrate;
a useful layer with a first face of which is disposed on the intermediate layer and a second face of which is free, having a useful thickness;
the structure being characterized in that:
the useful layer comprises a buried stop layer delimiting with the first face a fine active layer having a first thickness, the buried stop layer delimiting with the second face a thick active layer having a second thickness greater than the first thickness;
the useful layer comprises solely the stop layer and the fine active layer or solely the fine active layer in the first regions of the structure.

According to advantageous features of the disclosure, taken alone or in combination:
the useful layer is continuous over the entire extent of the structure;
the useful layer is non-continuous over the entire extent of the structure;
the first thickness is less than 20% of the useful thickness;
the buried stop layer is continuous over the entire extent of the structure;
the fine active layer has a uniformity of thickness better than 5% over the entire extent of the structure;
the fine active layer is formed from the same material as that of the thick active layer;
the fine active layer is formed from a material different from that of the thick active layer;
the fine active layer comprises a material chosen from silicon, silicon germanium and germanium;
the thick active layer comprises a material chosen from silicon, silicon germanium and germanium;
the intermediate layer comprises a material chosen from silicon oxide, silicon nitride, silicon oxynitride, a silicon germanium compound, porous silicon, silicon comprising microcavities and/or cracks filled with vacuum or gaseous species, the silicon containing nanoparticles;
the buried stop layer comprises a material chosen from highly doped silicon, silicon germanium, germanium, silicon carbide, or a compound comprising a plurality of elements chosen from silicon, germanium, carbon and tin;
the buried stop layer has a third thickness of between 0.01 microns and 2 microns;
the support substrate is composed of a material chosen from silicon, glass, sapphire, silicon carbide, alumina, aluminium nitride and ceramics; and
the support substrate comprises a layer of microelectronic or optoelectronic components or sensors.

BRIEF DESCRIPTION OF THE DRAWINGS

Other features and advantages of the disclosure will emerge from the following detailed description of certain embodiments of the disclosure with reference to the accompanying figures, in which.

DETAILED DESCRIPTION

In the descriptive part, the same references in the figures can be used for elements of the same type. The figures are schematic representations which, for the purpose of legibility, are not to scale. In particular, the thicknesses of the layers along the z-axis are not to scale compared with the lateral dimensions along the x- and y-axes; and the thicknesses of the layers relative to each other are not necessarily respected in the figures.

Figure 1A:
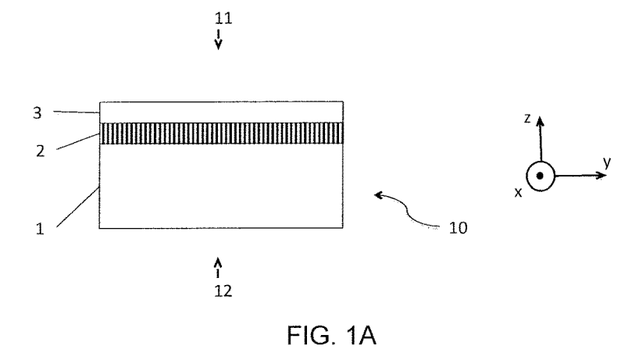
FIGS. 1A to 1D depict steps of the method for manufacturing a structure according to the disclosure.

The disclosure relates to a method for manufacturing a structure, in particular for a device with integrated microelectromechanical systems. As illustrated in FIG. 1A, the method comprises a first step of providing a donor substrate 10 comprising a front face 11 and a rear face 12. The characteristics of the donor substrate 10, which correspond to various embodiments of the disclosure, will be described in more detail in the remainder of the description.

The method comprises a second step (FIG. 1B) of providing a support substrate 20 which, by way of example, may be composed of a material chosen from silicon, glass, sapphire, silicon carbide, alumina, aluminium nitride, ceramics, etc.

Figure 1B:
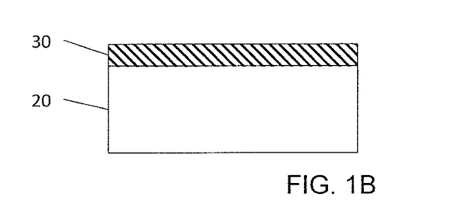

A third step of the method consists of the formation of an intermediate layer 30, on the front face 11 of the donor substrate 10 or on the front face of the support substrate 20 (FIG. 1B). The intermediate layer 30 will advantageously comprise a material chosen from silicon oxide, silicon nitride or silicon oxynitride. According to variants and in particular according to the device to be produced on the structure, the intermediate layer 30 may also be formed by a material chosen from a silicon germanium compound, porous silicon, a layer of silicon comprising microcavities and/or cracks filled with vacuum or gaseous species, a layer of silicon containing nanoparticles, or silicon oxide, for example.

The intermediate layer 30 can be produced by thermal oxidation, by liquid or vapor chemical deposition or by other techniques known from the prior art. It can also be doped in order to adapt its chemical etching properties, such as doping with boron or phosphorus in the case of a layer of silicon oxide. The intermediate layer 30 can also contain a plurality of sublayers, for example, a sublayer made from non-doped silicon oxide and a sublayer of silicon oxide doped with boron, or a sublayer of silicon oxide and a sublayer made from silicon nitride.

In general terms, the intermediate layer 30 will be composed of a material able to be etched selectively with respect to the material or materials making up the donor substrate 10.

Figure 1C:
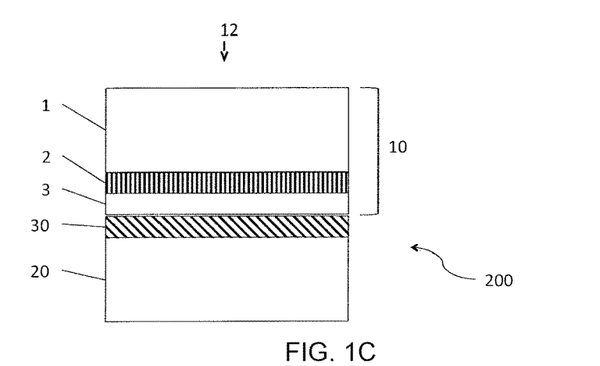

The method comprises a fourth step of assembling the donor substrate 10 and the support substrate 20 in order to dispose the intermediate layer 30 between the two substrates 10, 20 and to form the bonded structure 200 (FIG. 1C). The assembly step will preferentially be performed by direct bonding by molecular adhesion, a technique well known in the prior art based on the putting of two surfaces in direct contact, without using any specific bonding material (adhesive, wax, solder, etc.). Such an operation requires for the surfaces to be assembled to be sufficiently smooth and free from particles of contamination, and to be sufficiently close to each other to enable contact to be initiated, typically at a distance of less than a few nanometers.

Prior to the assembly, the substrates 10, 20 will advantageously have been cleaned in order to eliminate the particulate, organic and metallic contaminants of the surfaces to be bonded, for example, a cleaning of the RCA type. If necessary, the substrates 10, 20 can undergo a surface-preparation treatment, conferring on the surfaces to be assembled the required level of roughness and/or a configuration of surface chemical bonds favorable to good-quality direct bonding; by way of example, treatments of the mechanical chemical polishing and/or plasma activation type can be cited. Advantageously, after assembly by direct bonding, a consolidation heat treatment of the bonding interface will be carried out on the bonded structure 200. Depending on the materials making up the bonded structure 200, this heat treatment may vary between a few hundreds of degrees Celsius and approximately 1200° C., for a few minutes to a few hours.

Alternatively, the assembly step can consist of another bonding technique known to persons skilled in the art such as, for example, eutectic bonding, anodic bonding, metallic bonding, thermocompression bonding, polymer bonding, adhesive bonding, bonding via a layer of glass (glass-frit), etc.

Figure 1D:
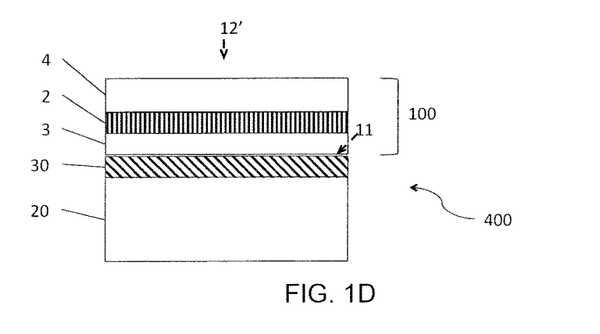

The fifth step of the method consists of the thinning of the rear face 12 of the donor substrate 10 in order to form a useful layer 100 having a first face 11 disposed on the intermediate layer 30 and a free second face 12' (FIG. 1D). The thickness of this useful layer 100, referred to as the useful thickness, is advantageously greater than 3 microns since it will be used for manufacturing microelectromechanical systems (MEMS) requiring thicknesses typically between 3 microns and 50 microns. Naturally, this range of thicknesses was given only by way of indication and smaller thicknesses or in particular greater thicknesses could be produced in the context of the disclosure. The thinning step can, for example, consist of a mechanical grinding using various granulometries of diamond wheels and a dry or mechanical chemical polishing. It may also involve dry or wet chemical etching steps and/or cleaning steps. The structure 400 then comprises the useful layer 100 disposed on the intermediate layer 30, itself disposed on the support substrate 20. The structure 400 according to the disclosure preferentially has, on the free second face 12', a roughness level of less than 0.5 nm rms (by AFM, atomic force microscope, measurement on a swept surface of 1×1 micron or 5×5 microns). This level of surface finish is compatible with subsequent steps of photolithography and etching involved in the manufacture of devices having recourse, in particular, to microelectronic technologies.

First Embodiment of the Disclosure

Figure 2A:
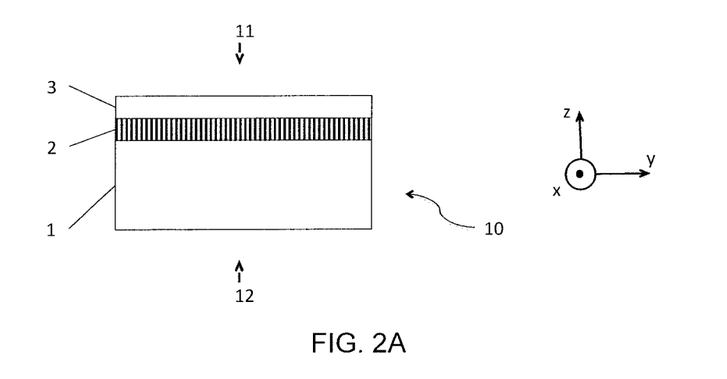
FIG. 2A depicts a donor substrate according to a first embodiment of the disclosure.

According to a first embodiment illustrated in FIG. 2A, the donor substrate 10 comprises an initial substrate 1, a buried stop layer 2 and a first layer 3 (hereinafter referred to as the fine active layer 3), the stop layer 2 being interposed between the initial substrate 1 and the fine active layer 3.

By way of example, the initial substrate 1 can be composed of silicon, silicon germanium, germanium, etc.

According to a first variant, the stop layer 2 can be produced by ion implantation of species such as, for example, boron, germanium, oxygen, nitrogen or carbon. The implanted species then form, at the implantation depth, a layer with a composition and/or crystalline structure different from that or those of the initial substrate 1, which constitutes the buried stop layer 2. The depth of implantation also defines the thickness of the fine active layer 3, referred to as the first thickness, above the stop layer 2. Preferentially, the first thickness will be less than 1 micron; advantageously it will even be less than 0.5 micron. This is because this fine active layer 3 is intended, in the structure 400 (FIG. 2B), for the manufacture of the integrated nanoelectromechanical systems (NEMS) of the device. This type of component requires fine and uniform active layer thicknesses for guaranteeing a good level of sensitivity and precision. According to this first variant of the first embodiment, the fine active layer 3 may have a first thickness defined at +/−1% having regard to the very good uniformity of implantation. The fine active layer 3 here consists of the same material as that of the initial substrate 1 since it is formed by a superficial layer thereof. To improve the crystallinity of the fine active layer 3, it will secondarily be possible to apply a heat treatment promoting its reconstruction or recrystallization.

According to a second variant, the stop layer 2 may be produced by ion implantation of species such as, for example, hydrogen and/or helium and/or argon. These gaseous species will form a fragile buried layer comprising microcavities able to develop under the effect of heat treatment. Advantageously, this implantation will be carried out locally in first predefined regions 110. After the performance of the fifth step of the method, according to the disclosure, step e) of thinning of the rear face of the donor substrate and application of a heat treatment will cause the exfoliation of the part of the useful layer 100 situated between free face 12' and the buried stop layer 2 to be level with the first regions 110. This variant is a particular embodiment of the disclosure; all the other embodiments, as will be seen in the remainder of the description, are based on the removal of the part of the useful layer 100 situated between its free face and the buried stop layer 2, level with the first regions 110, by etching techniques.

According to a third variant, the stop layer 2 may be formed on the front face of an initial substrate 1, by the production of a layer with a chemical composition and/or a crystalline structure different from those of the substrate 1. Such a layer may be produced by epitaxial growth, for example, in the case of a layer of silicon, the doping or composition of which would be significantly different from the doping and composition of an initial substrate 1 made from silicon. It may also be produced by deposition.

Without being limitative, the buried stop layer 2 can thus comprise a material chosen from highly doped silicon, silicon germanium, germanium, silicon carbide, or a compound comprising a plurality of elements chosen from silicon, germanium, carbon and tin.

According to the third variant, after the production of the stop layer 2, the fine active layer 3 of controlled thickness is formed, for example, by epitaxial growth or by deposition on the stop layer 2. Advantageously, the fine active layer 3 has good crystalline quality, the properties of the monocrystalline layers normally being more favorable than those of polycrystals or amorphous materials. Preferentially, the stop layer 2 will therefore have a crystalline structure compatible with the growth of a monocrystalline fine active layer 3. To improve the crystallinity of the fine active layer 3 after formation thereof, it is moreover possible to apply a recrystallization heat treatment. According to the third variant of the first embodiment, the fine active layer 3 has a first thickness the non-uniformity of which is less than 5%.

In some cases, it will be advantageous for the fine active layer 3 to consist of the same material as that of the initial substrate 1 and having substantially the same doping level (for example, monocrystalline silicon of given resistivity). Alternatively, the fine active layer 3 can consist of a material or composition different from that of the initial substrate 1, for example, a fine active layer 3, made from silicon may have a doping significantly different in type (p, n) or in quantity. The fine active layer 3 can also be a silicon germanium alloy, with the additional degree of freedom of choosing variable proportions of germanium.

For one or other of the variants stated for manufacturing the stop layer 2, the stop layer 2 may have a thickness (referred to as the third thickness, of between 0.01 micron and 2 microns.

Advantageously, according to the first embodiment of the disclosure, the fine active layer 3 is continuous over the entire extent of the donor substrate 10. This configuration is favorable to a high efficiency at the assembly step of the method according to the disclosure, since it does not give rise to any surface topology.

Figure 2B:
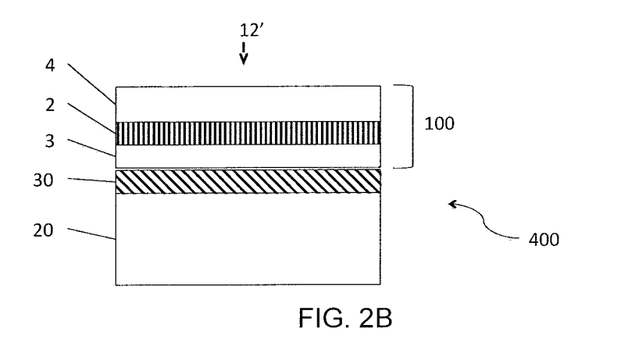
FIGS. 2B to 2G depict steps of the method for manufacturing a structure according to a first embodiment of the disclosure.

According to the first and third variants stated previously, the stop layer 2 is also continuous over the entire extent of the initial substrate 1. This configuration affords great flexibility of manufacture of the devices on the structure 400 according to the disclosure (FIG. 2B). This is because, during subsequent steps of manufacture of the devices with integrated microsystems and nanosystems on the structure 400, there does not exist, in this configuration, any constraint in alignment of the structure 400 for accessing local regions where a buried stop layer is defined.

According to the first embodiment of the disclosure, the structure 400 thus comprises the useful layer 100 disposed on the intermediate layer 30, itself disposed on the support substrate 20 (FIG. 2B). The useful layer 100 is composed, starting from its face 12', of a second layer 4 (hereinafter designated the thick active layer 4), the buried stop layer 2, and the fine active layer 3 disposed on the intermediate layer 30. The thick active layer 4 has a thickness, referred to as the second thickness, advantageously greater than the first thickness of the fine active layer 3. This structure 400 is suited to the manufacture of devices with integrated nanosystems and microsystems. This is because the useful layer 100 is intended to preserve its useful thickness over part of the structure 400 for the microsystems of the end device, while only the fine active layer 3 will remain on another part of the structure 400 for the nanosystems of the end device.

Figure 2C:
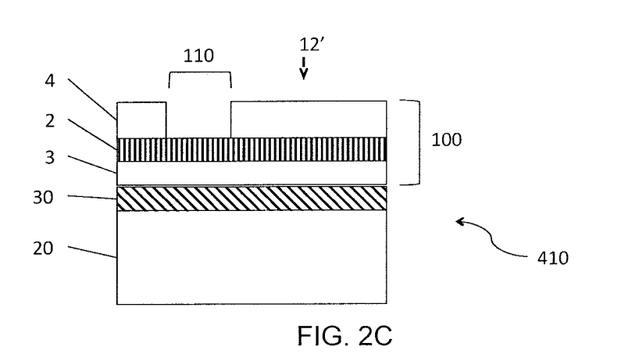

The manufacturing method according to the first embodiment of the disclosure further comprises a step of local removal in first regions 110 of the structure 400 of the thick active layer 4 delimited by the second face 12' and the buried stop layer 2 (FIG. 2C).

As stated previously with the second variant of a stop layer 2, removal may consist of local exfoliation of the thick active layer 4, because of the presence of a buried fragile layer locally at the first regions 110, instead of the buried stop layer 2. A heat treatment is advantageously carried out in order to grow the cavities and microcracks in the fragile layer and to lead to local detachment of the thick active layer 4 at the first regions 110. This variant corresponds to a particular implementation that will not be mentioned in any further detail in the remainder of this description.

According to the first and third variants of the stop layer 2, the local removal, in the first regions 110, of the thick active layer 4 is carried out by etching the useful layer 100 of the structure 400, as far as the buried stop layer 2 (FIG. 2C). This etching step will be referred to as "TALE" (standing for "thick active layer etching") in the remainder of the description for more clarity.

The first regions 110 and the face 12' of the structure 400 can be defined by a photolithography step, and then etched by a wet or dry chemical attack. The presence of the buried stop layer 2 allows a selective stopping of the etching on it, without affecting the quality or uniformity of the fine active layer 3.

The useful layer 100 of structure 410 thus obtained does not comprise the thick active layer 4 in the first regions 110, but only the stop layer 2 and the fine active layer 3. The first regions 110 correspond to regions in which the nanoelectromechanical systems (NEMS) will be produced.

Figure 2D:
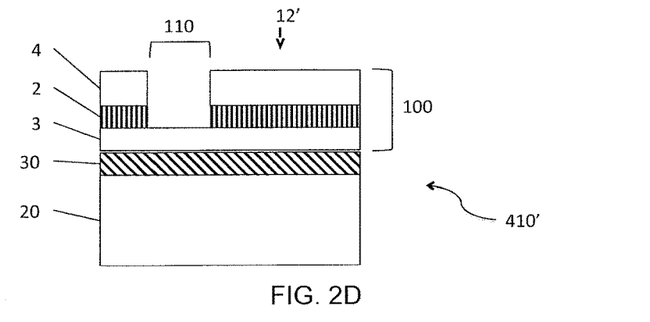

The manufacturing method may further comprise another step of etching the stop layer 2 (a step referred to as "SLE" (standing for "stop layer etching") so that the useful layer 100 comprises only the fine active layer 3 in all or part of the first regions 110, as illustrated in FIG. 2D. The stop layer 2 according to the disclosure is chosen so that the etching thereof is selective vis-à-vis the fine active layer 3.

Figure 2E:
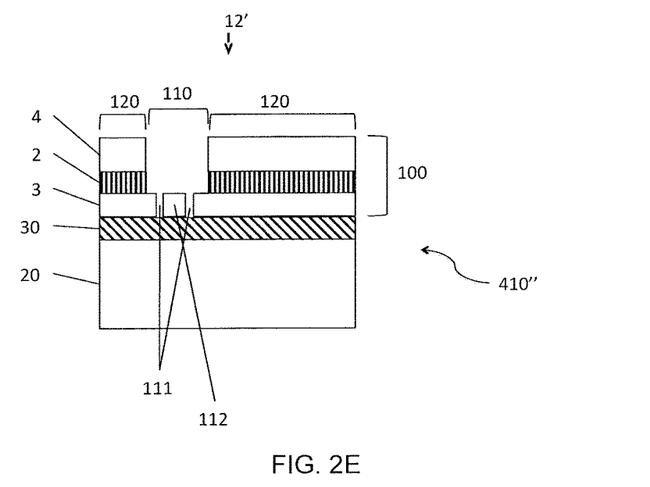

The structure 410' thus obtained can next be subjected to a new step of etching the first thickness of the fine active layer 3 (a step referred to as "FALE," standing for "fine active layer etching"), as far as the intermediate layer 30, in at least a first pattern 111, situated in the first regions 110 (FIG. 2E). The first pattern 111 will, for example, be defined by photolithography, before applying a dry or wet chemical etching or any other technique for etching the fine active layer 3. The first pattern 111 defines a MEMS component. This component functions with a suspended part, intended to be movable in the final arrangement: this suspended part will be produced from a membrane 112 of the fine active layer 3, defined by the first pattern or patterns 111 and which will be released during a first step of the method.

Figure 2F:
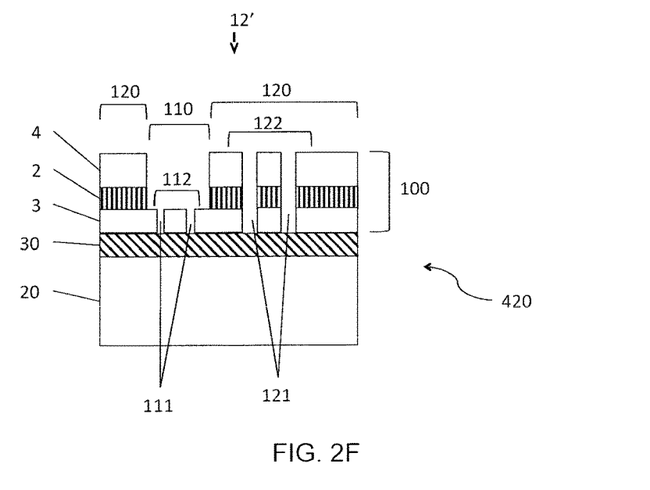

The structure 410", comprising the at least one first pattern 111 in the first regions 110, can be subjected to another etching step according to the manufacturing method of the disclosure. This step consists of the etching of a useful thickness of the useful layer 100 (a step referred to as "ULE," standing for "useful layer etching"), as far as the intermediate layer 30, in at least a second pattern 121, situated in second regions 120, to obtain the structure 420 (FIG. 2F). The second pattern 121 will, for example, be defined by photolithography, before applying a dry or wet chemical etching or any other technique for etching the useful layer 100, that is to say the successive etching of the thick active layer 4, of the stop layer 2 and of the fine active layer 3. The second pattern 121 defines a MEMS component. This component functions with a suspended part: the latter will be produced from a membrane 122 defined by the second pattern or patterns 121, and which will be released during a next etching step of the method.

Alternatively, the ULE etching step can be carried out before the FALE step, or the etching of the fine active layer 3 carried out during the ULE step can be carried out at the same time as the FALE etching.

Figure 2G:
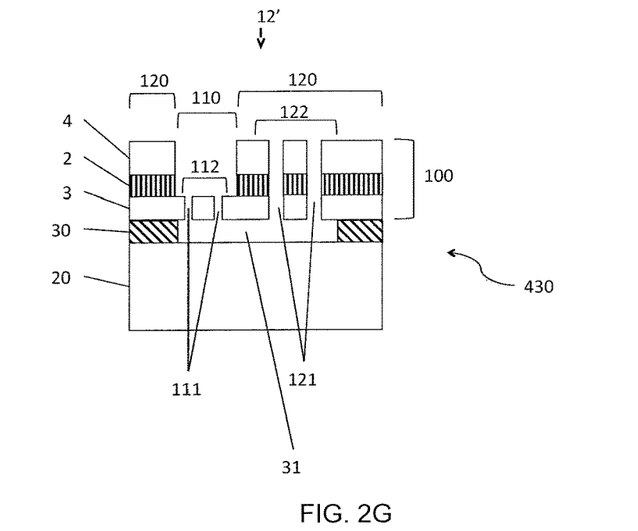

The next etching step of the method consists of a removal of the intermediate layer 30 (the step called "ILE," standing for "intermediate layer etching") in at least one part 31 of the first regions 110 and of the second regions 120 of the structure 430, in order to release at least one membrane 112 of the fine active layer 3 and at least one membrane 122 of the useful layer 100: the structure 430 is thus obtained (FIG. 2G). The intermediate layer 30 according to the disclosure is chosen so that its etching is at least selective vis-à-vis the support substrate 20 and the fine active layer 3.

Second Embodiment of the Disclosure

Figure 3A:
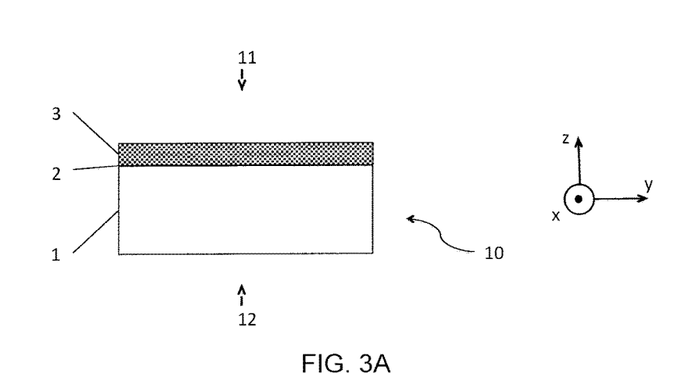
FIG. 3A depicts a donor substrate according to a second embodiment of the disclosure.

According to a second embodiment, illustrated in FIG. 3A, the donor substrate 10 comprises an initial substrate 1 and a first layer 3 (hereinafter designated as fine active layer 3) having a first thickness. The fine active layer 3 is composed of a material of a nature different from that of the initial substrate 1. This difference is sufficiently significant for the interface between these two materials to fulfill the role of a stop layer 2. By way of example, the initial substrate 1 may be made from silicon and the fine active layer 3 from silicon germanium deposited on the initial substrate 1. According to another example, the initial substrate 1 may be made from silicon and the fine active layer 3 from highly doped silicon, a doping that may moreover be directly exploited for the electrical properties of the membranes 112 that will be formed in the fine active layer 3. The different natures of these materials confer on them etching properties that are also different. In the field of microelectronics in general and devices with microelectromechanical systems in particular, the selective etching of one material with respect to another is a very widespread operation. It is possible to rely here on the techniques available to persons skilled in the art, see, for example, chapters 7 and 8 of the work "*MEMS Materials and Processes Handbook*," Reza Ghodssi, Pinyen Lin, editors, Springer, ISSN 1936-4407 ISBN 978-0-387-47316-1).

Among the etchings most used for selectively removing silicon, solutions of KOH, NaOH, $NH_4OH$, TMAH, EDP, $N_2H_4$, $HF/HNO_3$, $HF/HNO_3$/acetic acid will, with regard to wet etching in liquid solution, for example, be found. Other options and variants are also available to persons skilled in the art: plasma etchings, etchings by ion beam, electrochemical etchings, assisted by light beam or not.

Without this being limitative, the fine active layer 3 may comprise a material chosen from silicon, silicon germanium or germanium, the material of the initial substrate 1 for its part being chosen with a different nature or doping.

Preferentially, the first thickness is less than 1 micron, or even less than 0.5 microns; as previously stated, this fine active layer 3 is, in the structure 400 (FIG. 3B), intended for the manufacture of integrated nanoelectromechanical systems (NEMS) of the device, requiring controlled fine thicknesses of an active layer.

Advantageously, according to the second embodiment of the disclosure, the fine active layer 3 is continuous over the entire extent of the donor substrate 10. This configuration is favorable to a high efficiency at the assembly step of the method according to the disclosure, since it does not cause any surface topology.

Figure 3B:
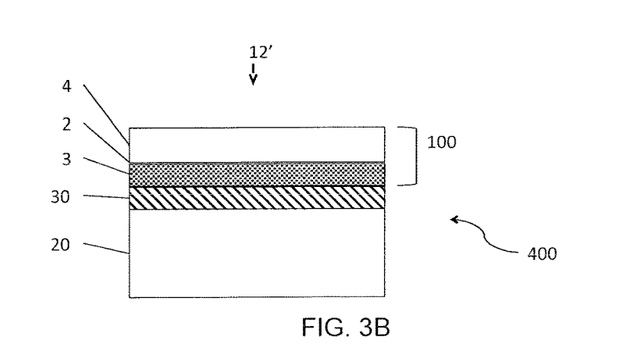
FIGS. 3B to 3F depict steps of the method for manufacturing a structure according to a second embodiment of the disclosure.

According to the second embodiment of the disclosure, the structure 400 thus comprises the useful layer 100 disposed on the intermediate layer 30, itself disposed on the support substrate 20 (FIG. 3B). The useful layer 100 is composed, starting from its face 12', of:
  a second layer 4 (hereinafter designated as thick active layer 4),
  the buried stop layer 2 corresponding to the interface between the thick active layer 4 and the fine active layer 3,
  and the fine active layer 3 disposed on the sacrificial layer 30.

The thick active layer 4 has a thickness, referred to as the second thickness, which is greater than the first thickness of the fine active layer 3. Structure 400 is suited to the manufacture of devices with integrated nanosystems and microsystems as the useful layer 100 will keep its useful thickness in a part of the structure for the microsystems (MEMS) of the end device, and only the fine active layer 3 will remain in another part of the structure 400 for the nanoelectromechanical systems (NEMS) of the end device.

The manufacturing method according to the second embodiment of the disclosure further comprises the TALE step of etching the thick active layer 4 of the structure 400, as far as the fine active layer 3, in first regions 110 of the structure 400. The first regions 110 on the face 12' of the structure 400 can be defined by a photolithography step, and then etched by a wet or dry chemical attack. The interface between the thick active layer 4 and the fine active layer 3 fulfills a role of a buried stop layer 2, allowing selective stoppage of the etching on the fine active layer 3, without damage thereto.

Figure 3C:
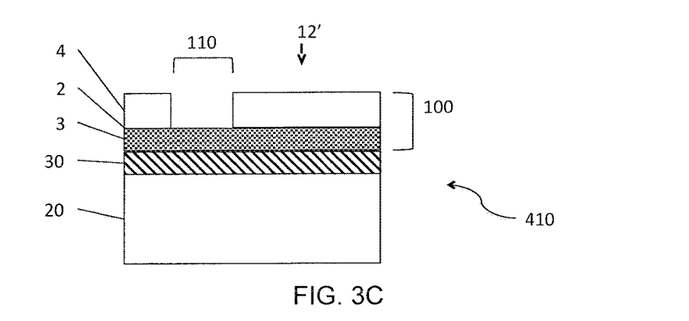

The useful layer 100 of the structure 410 thus obtained (FIG. 3C) does not comprise the thick active layer 4 in the first regions 110, but only the fine active layer 3. The first regions 110 correspond to the regions in which the nanoelectromechanical systems (NEMS) will be produced.

The manufacturing method according to the second embodiment, therefore, does not comprise the SLE step of local removal of the stop layer 2 described in the first embodiment, this consisting of the interface between the thick active layer 4 and the fine active layer 3.

Figure 3D:
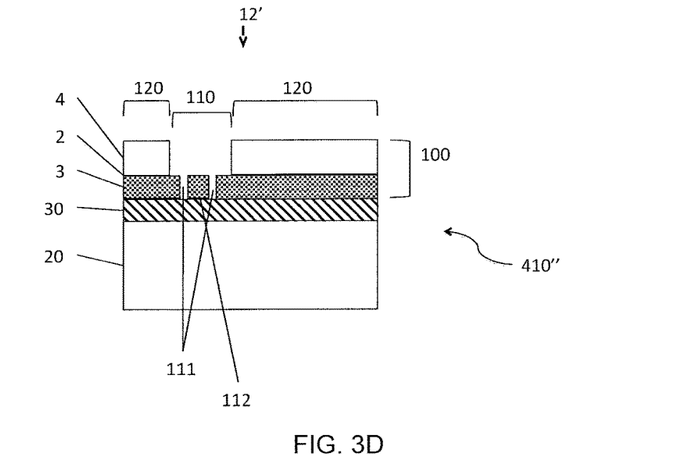

The structure 410 can next be subjected to the FALE step of etching the first thickness of the fine active layer 3, as far as the intermediate layer 30, in at least one first pattern 111 situated in the first regions 110; this gives rise to the structure 410" illustrated in FIG. 3D. The first pattern 111 will, for example, be defined by photolithography, before applying a dry or wet chemical etching or any other technique allowing etching of the fine active layer 3. The first pattern 111 defines a NEMS component. This component functions with a suspended part: this will be produced from a membrane 112 of the fine active layer 3, defined by the first pattern or patterns 111 and which will be released during the ILE etching step of the method.

Figure 3E:
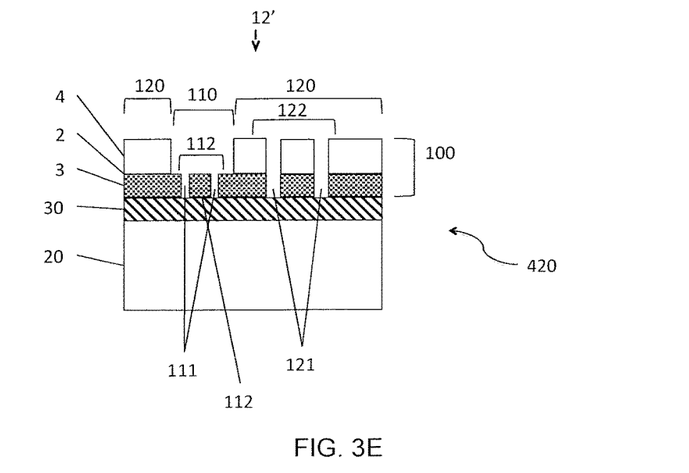

The structure 410", comprising the first pattern 111 in the first regions 110, can be subjected to the ULE etching step according to the manufacturing method of the disclosure, which consists of the etching of the useful thickness of the useful layer 100, as far as the intermediate layer 30, in at least one second pattern 121, situated in second regions 120 of the structure, in order to obtain the structure 420 (FIG. 3E). The second pattern 121 will, for example, be defined by photolithography, before applying a dry or wet chemical etching or any other technique for etching the useful layer 100, that is to say, the successive etching of the thick active layer 4, of the stop layer 2 and of the fine active layer 3. The second pattern 121 defines a NEMS component. Its suspended part will be produced from a membrane 122 of the useful layer 100 defined by the second pattern or patterns 121, and which will be released during the ILE etching step of the method.

Alternatively, the ULE etching step can be performed before the FALE step, or the etching of the fine active layer 3 carried out during the ULE step can be performed at the same time as the FALE etching.

Figure 3F:
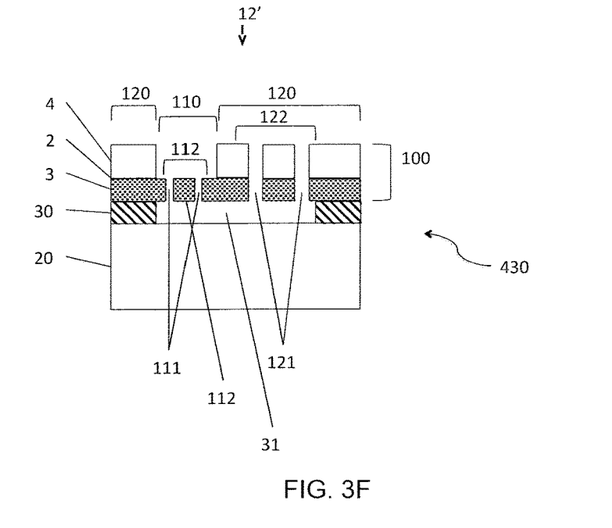

The ILE etching step consists of a removal of the intermediate layer 30 in at least a part 31 of the first regions 110 and of the second regions 120 of the structure, in order to release at least one membrane 112 of the fine active layer 3 and at least one membrane 122 of the useful layer 100, giving rise to the structure 430 (FIG. 3F). The intermediate layer 30 according to the disclosure is chosen so that its etching is at least selective vis-à-vis the support substrate 20 of the fine active layer 3.

Third Embodiment of the Disclosure

Figure 4A:
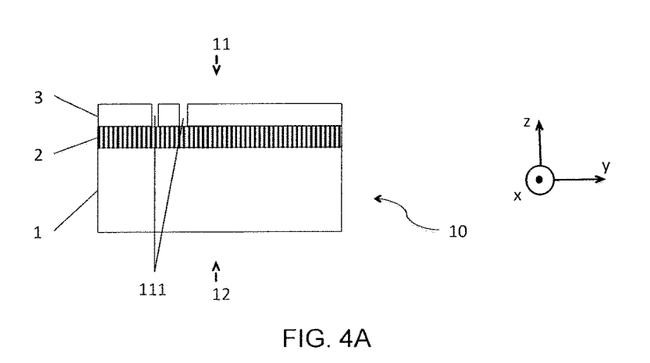
FIG. 4A depicts a donor substrate according to a third embodiment of the disclosure.

According to a third embodiment illustrated in FIG. 4A, the donor substrate 10 comprises an initial substrate 1, a stop layer 2 and a first layer 3 (hereinafter designated as the fine active layer 3) not continuous over the entire extent of the donor substrate 10. The initial substrate 1, the stop layer 2 and the fine active layer 3 can be described, with regard to the materials constituting them and the method steps for formation thereof, with reference to the first embodiment of the disclosure.

In the third embodiment of the disclosure, the donor substrate 10 is subjected to a step of defining the first patterns 111 on its front face 11 and of etching the fine active layer 3 at the first patterns 111, prior to the connection to the support substrate 10. The etching step (referred to as "FALE-bb," standing for "fine active layer etching before bonding") aims here to remove only the first thickness at the first patterns 111. The presence of the stop layer 2 under the fine active layer 3 assists the clear stopping of the etching; after etching of the first thickness of fine active layer 3. As a reminder, in the structures 410", 420 and 430 according to the disclosure, the first patterns 111 define, in first regions 110, the nanosystems.

Figure 4B:
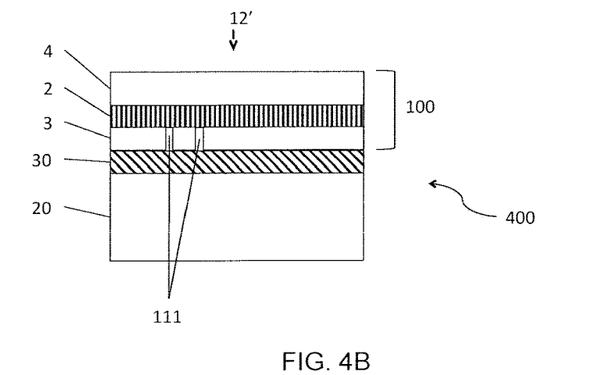
FIGS. 4B to 4F depict steps of the method for manufacturing a structure according to a third embodiment of the disclosure.

According to the third embodiment, the donor substrate 10, comprising its discontinuous fine active layer 3, is assembled on the support substrate 10, the intermediate layer 30 being disposed on one or other of the substrates 10, 20 (FIG. 4B). Cavities are thus present at a bonding interface, facing the first patterns 111. The size of the first patterns 111, around a few hundreds of nanometers, is entirely compatible with direct bonding by molecular adhesion and subsequent thinning of the rear face 12 of the donor substrate 10 to a thickness greater than 3 microns. This configuration corresponds to an assembly with cavities and does not require topology resorption: the surface preparations mentioned in the first embodiment are applicable for obtaining good bonding quality.

Optionally, the fine active layer 3 can also be etched at the second patterns 121, as far as the buried stop layer 2.

After the thinning step of the manufacturing method, the structure 400 obtained according to the third embodiment and illustrated in FIG. 4B comprises:
  the support substrate 20;
  the intermediate layer 30 disposed on the support substrate 20;
  the fine active layer 3, disposed on the intermediate layer 30; the fine active layer 3 is discontinuous, which gives rise to the presence of cavities facing the first patterns 111 (and optionally facing the second patterns 121);
  the stop layer 2, disposed on the fine active layer 3;
  the second layer 4 (hereinafter designated as thick active layer 4) disposed on the stop layer 2; the buried stop layer 2 and the fine active layer 3 constituting the useful layer 100.

Figure 4C:
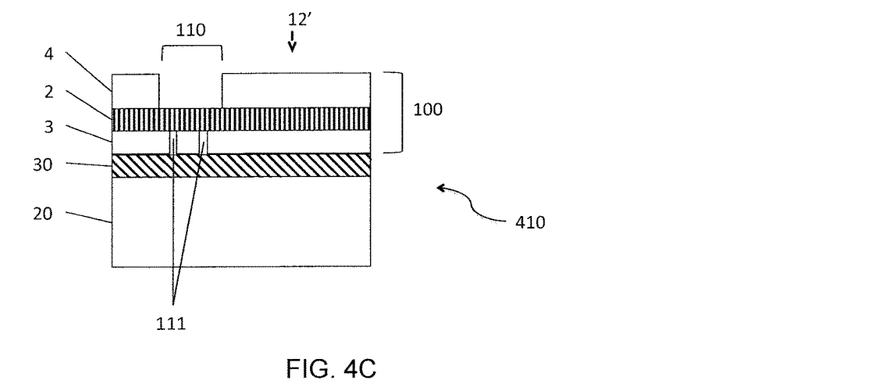

The manufacturing method according to the third embodiment of the disclosure further comprises the TALE step of etching the thick active layer 4, as far as the buried stop layer 2 in first regions 110 of the structure 410 (FIG. 4C). The first regions 110 on the face 12' of the structure 410 can be defined by a photolithography step, and then etched by a wet or dry chemical attack. The presence of the buried stop layer 2 allows a selective stoppage of the etching on it. This step of defining first regions 110 requires an alignment to ensure a sufficiently precise positioning of the first patterns 111 (present in the form of buried cavities in the bonded structure) in the first regions 110.

The useful layer 100 of the structure 410 (FIG. 4C) thus obtained does not comprise the thick active layer 4 in the first regions 110, but only the stop layer 2 and the fine active layer 3. The first regions 110 correspond to the regions in which the nanoelectromechanical systems (NEMS) will be produced.

Figure 4D:
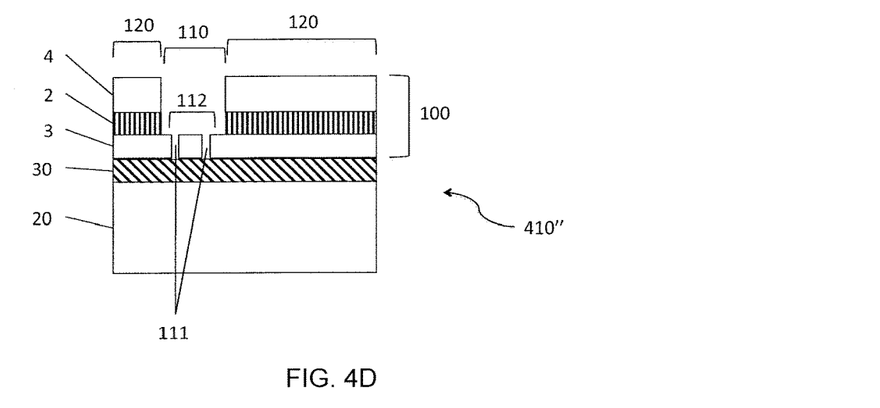

The manufacturing method may further comprise the SLE step of etching the stop layer 2 so that the useful layer 100 comprises only the fine active layer 3 in all or part of the first regions 110, giving rise to the structure 410" illustrated in FIG. 4D. The stop layer 2 according to the disclosure is chosen so that the etching thereof is selective vis-à-vis the fine active layer 3; advantageously, the etching of the stop layer 2 will also be selective vis-à-vis the intermediate layer 30.

The first patterns 111 having been etched previously on the donor substrate 10, the method according to the third embodiment of the disclosure does not necessarily comprise an FALE step of etching the fine active layer 3.

Figure 4E:
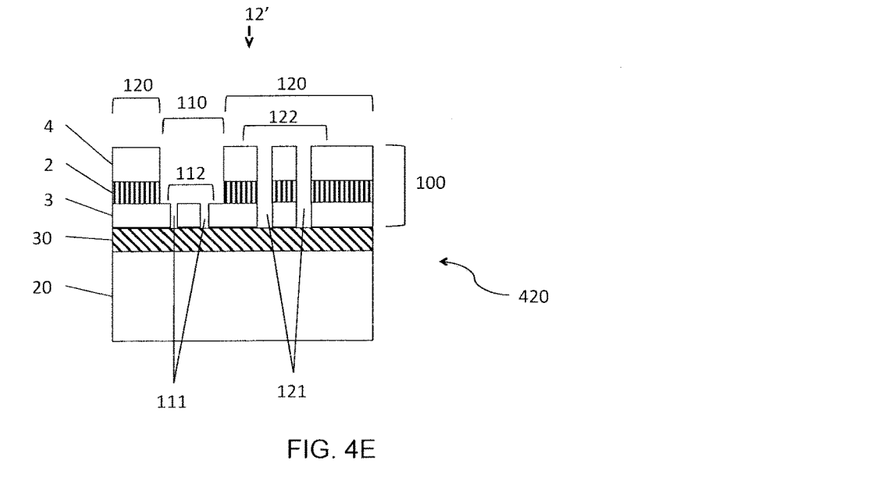

The structure 410", comprising the first pattern 111 in the first regions 110, may be subjected to the ULE etching step according to the manufacturing method of the disclosure. This step consists of the etching of the useful thickness of the useful layer 100 as far as the intermediate layer 30 in at least one second pattern 121, situated in second regions 120 of the structure, in order to obtain the structure 420 (FIG. 4E). The second pattern 121 will, for example, be defined by photolithography, before applying a dry or wet chemical etching or any other technique for etching the useful layer 100, that is to say, the successive etching of the thick active layer 4, of the stop layer 2 and of the fine active layer 3. The second pattern 121 defines a MEMS component. Its suspended part will be produced from a membrane 122 of the useful layer 100, defined by the second pattern or patterns 121 and which will be released during the ILE etching step of the method.

Figure 4F:
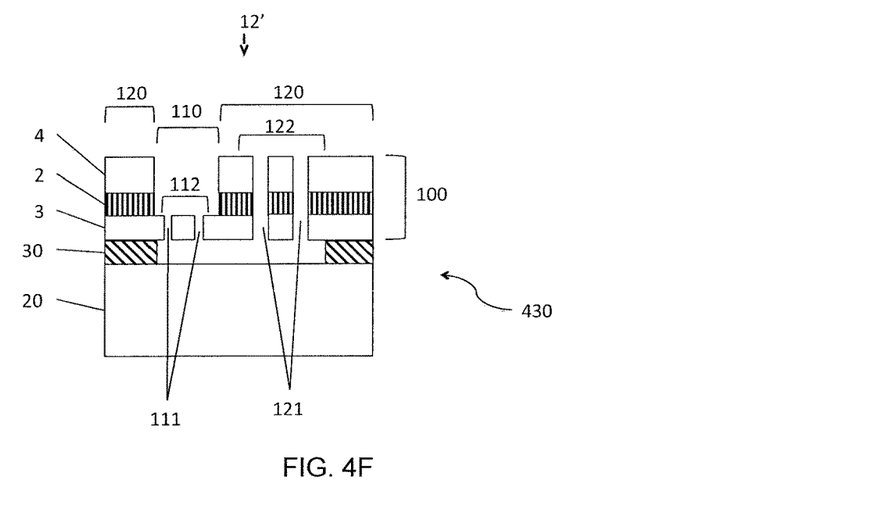

The ILE etching step consists of a removal of the intermediate layer 30 in at least a part 31 of the first regions 110 and of the second regions 120 of the structure, in order to release at least one membrane 112 of the fine active layer 3 and at least one membrane 122 of the useful layer 100, giving rise to the structure 430 (FIG. 4F). The intermediate layer 30 according to the disclosure is chosen so that its etching is at least selective vis-à-vis the support substrate 20 and fine active layer 3.

Variant Implementations of the Disclosure

Figure 5A:
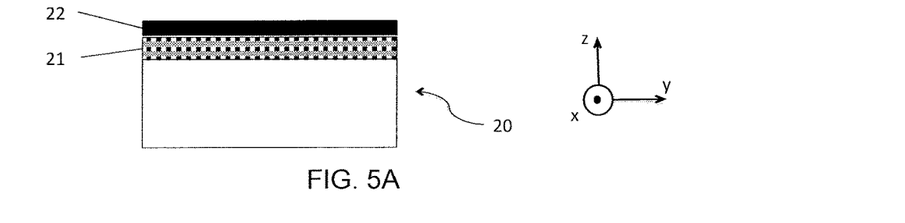
FIGS. 5A to 5C depict a support substrate, a donor substrate and a structure according to the disclosure.

According to a variant implementation that can be applied to the first, second or third embodiment of the disclosure, the support substrate 20 may comprise a layer 21 of microelectronic components, which may be active or passive (FIG. 5A). The layer 21 may also comprise other types of components, for example, optoelectronic components or other types of sensors, or even other integrated MEMS devices.

Figure 5B:
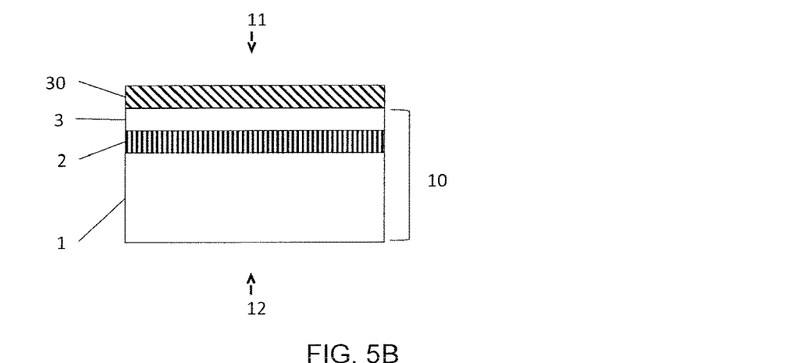

An encapsulation layer 22 will preferentially be present on the layer 21 of components. This layer 22 is smoothed prior to the assembly step of the method, so as to confer on the surface of the layer 22 the required properties of flatness and roughness for direct bonding of good quality. A donor substrate, for example, having the characteristics described in the first embodiment of the disclosure, is illustrated in FIG. 5B. It also comprises, on its front face 11, the intermediate layer 30.

The manufacturing method according to the disclosure provides for an assembly of respective donor and support substrates 10, 20, for example, by molecular adhesion. According to a variant, the assembly step may consist of a bonding via a layer of adhesive material. This variant may, in particular, be used when the subsequent steps of manufacturing the devices are carried out at low temperature, thus avoiding degrading the adhesive layer. A person skilled in the art will also be able to use other known techniques of bonding substrates, such as, for example, eutectic bonding or polymer bonding, and bonding by thermocompression.

Figure 5C:
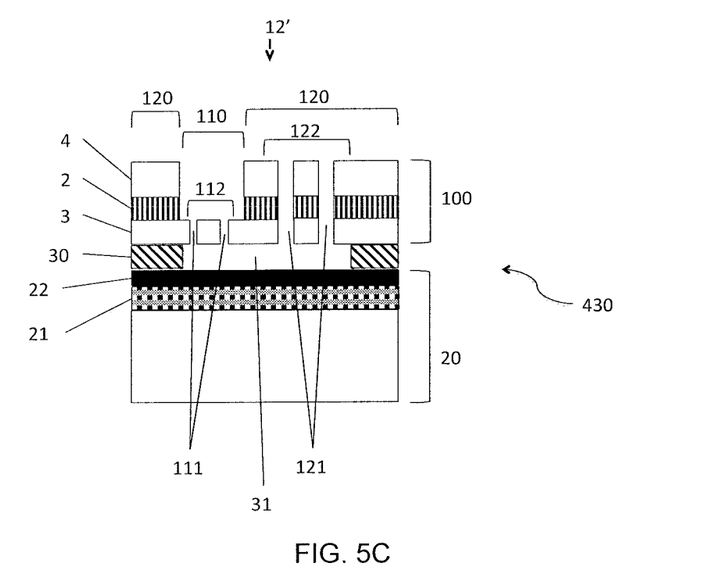

The structure 430 illustrated in FIG. 5C comprises a support substrate 20, on which a layer 21 of components is disposed, encapsulated by a layer 22. The intermediate layer 30 is disposed on the encapsulation layer 22, and has been locally etched in order to release the suspended parts of the NEMS and MEMS, respectively, in all or part of the first regions 110 and second regions 120. Alternatively, the encapsulation layer 22 may replace the intermediate layer 30.

The useful layer 100 comes next: in first regions 110 of the structure 430 comprising the nanosystems, the useful layer 100 comprises only the fine active layer 3 (forming in particular at least one suspended membrane 112 of the NEMS component); in second regions 120, the useful layer 100 comprises the thick active layer 4, disposed on the stop layer 2, itself disposed on the fine active layer 3 (forming in particular at least one suspended membrane 122 of the MEMS component).

The devices with integrated nanoelectromechanical and microelectromechanical systems may be connected to the underlying microelectronic components, for example, by means of conductive interconnection trenches.

Naturally, the disclosure is not limited to the embodiments and examples described, and variant embodiments can be made without departing from the scope of the disclosure as defined by the claims.

The method and structures according to the disclosure have been described with reference to a device aimed at co-integrating NEMS and MEMS on the same structure. The disclosure is not limited to this application; the method and structures (400, 410, 410', 410", 420, 430) according to the disclosure can be used for manufacturing microsystems in the field of microelectronics, optoelectronics, microengineering, etc.

It can, for example, procure advantages in the field of microfluidics, which may require the etching of cavities or channels at various levels in the thickness of a useful layer 100. The presence of the buried stop layer 2 between the thick active layer 4 and the fine active layer 3 can make it possible to produce channels on at least two levels in the useful layer 100.

Depending on the application, the intermediate layer 30 may or may not be used as a sacrificial layer.

The disclosure can also procure advantages in the field of photonics for producing, on the same SOI substrate, in the useful layer 100, functions of guidance of the light in the thick active layer 4 and functions of coupling between an incident light beam carried by an optical fiber and the waveguide structures, by virtue of the presence of an alternation of regions of variable thickness in the useful layer 100. In this application case, the fine active layer 3 and thick active layer 4, the stop layer 2 and the intermediate layer 30 will also be chosen according to their optical properties. The intermediate layer 30 will in this case not have the function of a sacrificial layer.

What is claimed is:

1. A method for manufacturing a structure, comprising:
   a) providing a donor substrate comprising a front face and a rear face and comprising a buried stop layer and a fine active layer having a first thickness less than a useful thickness, the fine active layer disposed between the front face of the donor substrate and the stop layer;
   b) providing a support substrate;
   c) forming an intermediate layer on the front face of the donor substrate or on the support substrate;
   d) assembling the donor substrate and the support substrate so as to dispose the intermediate layer between the donor substrate and the support substrate;
   e) thinning the rear face of the donor substrate so as to form a useful layer of the useful thickness having a first face disposed on the intermediate layer and a second free face; and
   f) after step e), removing in first regions of the structure, a thick active layer delimited by the second free face of the useful layer and the stop layer, the buried stop layer being continuous over the entire extent of the structure when said removal in first regions is performed;
   the method further comprising:
   etching the stop layer so that the useful layer comprises only the fine active layer in the first regions;
   etching the first thickness of the fine active layer in first patterns in the first regions;
   etching the useful thickness of the useful layer in second patterns in second regions; and
   removing the intermediate layer in at least part of the first regions and second regions of the structure so as to release at least one membrane of the fine active layer and at least one membrane of the useful layer.

2. The method of claim 1, wherein the fine active layer is continuous over the entire extent of the donor substrate.

3. The method of claim 1, wherein the fine active layer is non-continuous over the entire extent of the donor substrate.

4. The method of claim 1, wherein the useful thickness is greater than 3 microns.

5. The method of claim 1, wherein the first thickness is less than 20% of the useful thickness.

6. The method of claim 1, wherein the first thickness is less than 1 micron.

7. The method of claim 1, wherein the stop layer is formed by ion implantation.

8. The method of claim 7, wherein ions implanted by the ion implantation are selected from the group consisting of hydrogen, helium, argon, boron, oxygen, nitrogen and carbon.

9. The method of claim 1, further comprising forming the donor substrate, and wherein forming the donor substrate comprises:
 forming a layer on the front face of an initial substrate, the layer having a chemical composition or crystalline structure different from that of the initial substrate, the layer forming the stop layer; and
 forming the fine active layer of controlled thickness on the stop layer.

10. The method of claim 1, wherein the fine active layer has a uniformity of thickness better than 5% over the entire extent of the structure.

11. The method of claim 1, wherein the fine active layer and the thick active layer comprise the same material.

12. The method of claim 1, wherein the fine active layer is formed from a material different from a material of the thick active layer.

13. The method of claim 1, wherein the fine active layer comprises a material selected from the group consisting of silicon, silicon germanium, and germanium.

14. The method of claim 1, wherein the thick active layer comprises a material selected from the group consisting of silicon, silicon germanium, and germanium.

15. The method of claim 1, wherein the intermediate layer comprises a material selected from the group consisting of silicon oxide, silicon nitride, silicon oxynitride, a silicon germanium compound, porous silicon, silicon comprising microcavities and/or cracks filled with vacuum or gaseous species, and silicon containing nanoparticles.

16. The method of claim 1, wherein the buried stop layer comprises a material selected from the group consisting of highly doped silicon, silicon germanium, germanium, silicon carbide, and a compound comprising a plurality of elements chosen from silicon, germanium, carbon and tin.

17. The method of claim 1, wherein the buried stop layer has a third thickness of between 0.01 micron and 2 microns.

18. The method of claim 1, wherein the support substrate comprises a material selected from the group consisting of silicon, glass, sapphire, silicon carbide, alumina, aluminum nitride and ceramics.

19. The method of claim 1, wherein the support substrate comprises a layer of microelectronic or optoelectronic components or sensors.

* * * * *